United States Patent [19]

Blum

[11] 4,008,430
[45] Feb. 15, 1977

[54] AUTOMOTIVE TEST APPARATUS FOR COUPLING TO THE IGNITION SYSTEM OF AUTOMOTIVE INTERNAL COMBUSTION ENGINES

[75] Inventor: Rudolf Blum, Wendlingen, Germany
[73] Assignee: Robert Bosch G.m.b.H., Stuttgart, Germany
[22] Filed: Oct. 9, 1975
[21] Appl. No.: 620,927
[30] Foreign Application Priority Data
  Dec. 19, 1974 Germany .................... 2460046
[52] U.S. Cl. .................. 324/15; 324/16 T; 307/252 W; 307/265
[51] Int. Cl.² .................................. F02P 17/00
[58] Field of Search ............. 324/15, 16 R, 16 S, 324/16 T; 307/252 W, 252 R, 246, 261, 265, 268, 309

[56] References Cited
UNITED STATES PATENTS

| | | | |
|---|---|---|---|
| 3,553,535 | 1/1971 | Weber | 307/252 W X |
| 3,961,240 | 6/1976 | Pohl | 324/16 T X |
| 3,970,872 | 7/1976 | Kuhn et al. | 307/265 |

Primary Examiner—Stanley T. Krawczewicz
Attorney, Agent, or Firm—Flynn & Frishauf

[57] ABSTRACT

To prevent transfer of stray pulses from the ignition system to test apparatus, a pulse-shaping circuit is connected between the output of the ignition system and the test apparatus itself which includes a semiconductor switch providing an output signal to the test apparatus upon change of state thereof, and a charge storage circuit connected to the coupling element of the test system to the ignition system and to the semiconductor switch, the charge storage circuit having a short loading time and a re-loading or discharge time which is long with respect to the loading time thereof to rapidly transfer pulses to the switch and cause rapid change of state thereof while slowly unloading the charge and prevent further change of state of the switch during the unloading time, and thus suppress and eliminate stray pulses.

10 Claims, 3 Drawing Figures

AUTOMOTIVE TEST APPARATUS FOR COUPLING TO THE IGNITION SYSTEM OF AUTOMOTIVE INTERNAL COMBUSTION ENGINES

The present invention relates to test apparatus for automotive internal combustion engines and more particularly to test apparatus adapted for connection to the ignition circuit in which trigger pulses are derived from an ignition cable of the engine.

Various types of test apparatus use trigger pulses derived from the ignition circuit of internal combustion engines; engine testers, timing lights, and other apparatus utilize trigger pulses derived, for example, from a current transformer in form of a clip-on transducer connected to the common ignition cable, or to one of the spark plug ignition cables. Various stray pulses arise in automotive electrical systems which may have substantial peak voltages and which may, therefore, falsely trigger the specific test apparatus connected to the clip-on transducer. Various types of trigger pulses, for example as derived from specific types of clip-on transducers, provide outputs which can be utilized only in specific types of test apparatus, and in other types not at all.

It is an object of the present invention to provide a wave-shaping circuit which is adapted for use in test apparatus for automotive-type internal combustion engines and which provides an output pulse of predetermined wave shape while suppressing outputs which would otherwise be derived from erroneous or stray pulses which may occur in the ignition system. The circuit should, further, suppress trigger pulses which occur due to irregularities of the specific pulses in the ignition system, and be adapted for use with many different types of engines.

SUBJECT MATTER OF THE PRESENT INVENTION

Briefly, a semiconductor switch is used which changes state and, upon change of state, provides the output signal. The input is applied to a storage circuit which rapidly transmits a pulse to the semiconductor switch but stores the pulse and holds it for a predetermined time; thus, repetitive change of state of the semiconductor switch during the storage time is suppressed and stray pulses are not transmitted to the output from the circuit.

The invention will be described by way of example with reference to the accompanying drawings, wherein.

Figure 1:
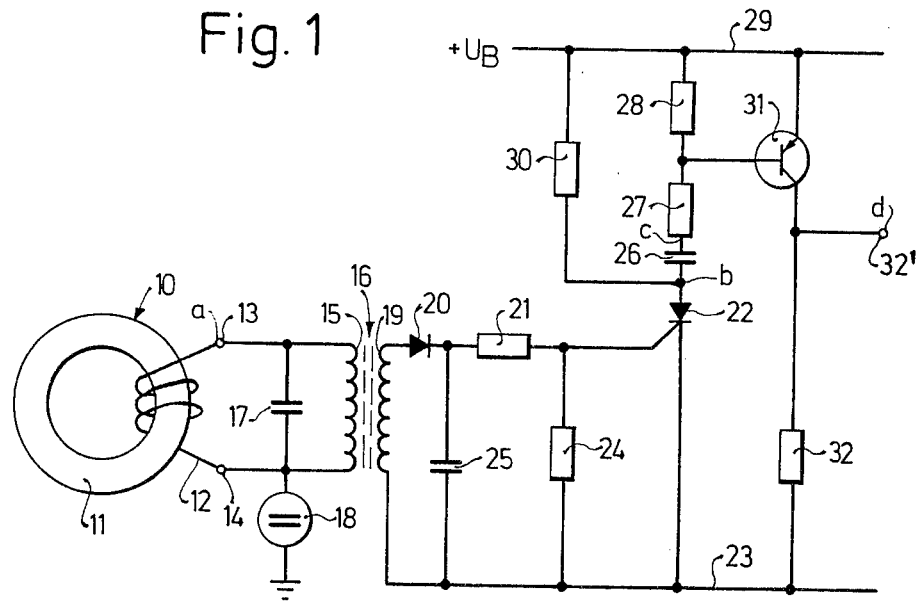
FIG. 1 is a highly schematic circuit diagram of the circuit in accordance with the present invention utilizing a thyristor, typically a silicon-controlled rectifier (SCR) as a semiconductor switch.

A pulse transducer 10 (FIG. 1), shown as a toroidal core 10 which may be slipped over an ignition cable for example, has a coil 12 wound thereon, forming a transducer coil. Coil 12, having terminals 13, 14, is connected to the primary 15 of a transformer 16. A capacitor 17 is connected between the input terminals; a glow discharge lamp 18 is connected between one of the terminals of transformer 16 and ground, or chassis, to prevent excessive voltages. The core 11 may also be split, and thus can be formed as clip-on element.

The secondary 19 of transformer 16 is connected through a diode 20 to a coupling resistor 21. Coupling resistor 21 is connected to the gate electrode of an SCR 22, the cathode of which is connected to a common supply line 23. The gate electrode of SCR 22 is connected to line 23 through a resistor 24. The junction between the cathode of diode 20 and resistor 21 is connected to line 23 through a capacitor 25. The second terminal of the secondary 19 of transformer 16 likewise is connected to common line 23.

The anode of SCR 22 is connected to a capacitor 26 which is series connected through two resistors 27, 28, forming a voltage divider, to a common supply bus 29, providing a positive supply voltage, the negative of which is connected to line 23. A discharge resistor 30 is connected in parallel to the series circuit formed of capacitor 26 and resistors 27, 28. The control electrode of a switching transistor 31 is connected to the junction or tap point of the voltage divider formed of resistors 27, 28. Its emitter is connected to line 29; its collector forms the output terminal 32', and is additionally connected through resistor 32 to the negative common supply line 23.

Figure 2:
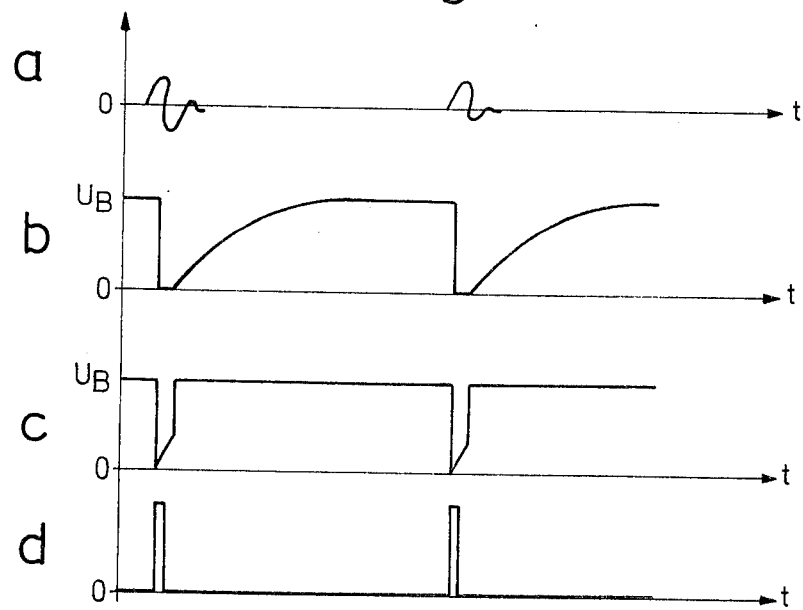
FIG. 2 is a series of graphs illustrating the operation of the circuit of FIG. 1.

Operation, with reference to the lettered subscripts on FIG. 1 and FIG. 2: Let it be assumed that the signal shown in graph (a) of FIG. 2 is induced in the winding 12 of transducer 10. This signal, which is a typical ignition signal, is transmitted through transformer 16 to diode 20 where it is rectified. The positive portion of the trigger signal on line (a) of FIG. 2 causes firing of SCR 22. The capacitor 26 which, under normal or quiescent condition is discharged, now begins to charge, with a current determined by the value of resistors 27, 28. The voltage at the anode of the thyristor 22, that is a junction (b) is indicated at line (b) of FIG. 2. The voltage drop across resistors 27, 28 is used to control the switching state of switching transistor 31. The voltage at the junction of resistor 27 and capacitor 28 is seen at line (c) of FIG. 2. The output signal derived from the collector of switching transistor 31 is shown in line (d) of FIG. 2. When the charge current through capacitor 26 becomes less than the holding current through the SCR, SCR 22 will block and the voltage at point (c) will rise to the voltage of line 29, that is, to $+U_B$. Capacitor 26 then can discharge through resistor 30. The SCR 22 cannot fire again due to pulses being applied through diode 20 to its gate during the discharge of the capacitor 26. Thus, no further signals at terminal 32' can arise. The time constant during which capacitor 26 discharges over resistor 30 should be made substantial, and should be so selected that the capacitor will discharge in that time which corresponds to the highest speed of the internal combustion engine to be tested, that is, which corresponds to the time interval of ignition pulses being applied to transducer 10 at maximum expected engine speed. The glow discharge element 18 connected to the input of the transformer 16 provides additional protection of the system. If, for example due to defective elements or insulation, an ignition or spark pulse should flash over to line 12, or to a grounded element such as a ground shield, glow discharge element 18 will break down and prevent damage to the apparatus.

Transducer 10 can be applied to any ignition cable in any desired direction. The capacitor 17 improves the wave shape of the input to the circuit by providing an input oscillatory circuit so that the first positive and the first negative half wave of the trigger signal have an approximately uniform amplitude.

Figure 3:
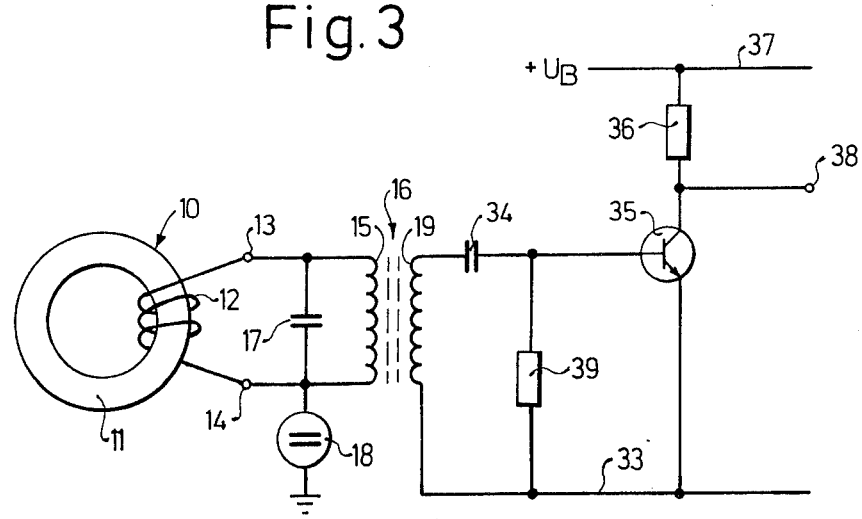
FIG. 3 is a simplified circuit using a transistor as the semiconductor switch.

The circuit of FIG. 3 utilizes a transistor as the switching element; similar elements to those previously shown and described have been given the same reference numerals and will not be described in detail again.

The secondary 19 of transformer 16 is connected to a common or chassis connection 33; the other terminal of the secondary 19 is connected to a capacitor 34 which is connected to the base of a switching transistor 35 and also to a resistor 39 connected to the common bus 33. The collector of the switching transistor 35 is connected through a resistor 36 to common supply line 37, connected to a positive source of supply $+U_B$. The collector of switching transistor 35 is further connected to output terminal 38, from which a previously determined, defined output signal can be derived. The emitter of switching transistor 35 is connected to the common supply line 33. The resistor 39 forms a discharge resistor for capacitor 34.

OPERATION

A trigger signal, for example the signal shown in graph (a) of FIG. 2, applied to the secondary 19 of transformer 16 causes charging of capacitor 34. The positive signal being instantaneously transmitted to the base of the switching transistor, however, causes this transistor 35 to become instantaneously conductive for a short period of time, so that the output signal 38 will have a pulse of uniform pulse length and of an amplitude determined by the voltage $U_B$ appear thereat. Further peaks being sensed by the transducer 10 applied through the transformer 16 are blocked from the switching transistor 35 since capacitor 34 is now charged. New ignition pulses can be applied to the switching transistor 35 only after capacitor 34 has discharged through the resistor 39. The time constant for the discharge of the capacitor 34 is so selected that it is long, but just smaller than the shortest time distance between adjacent trigger pulses to be tested or sensed.

Stray or noise pulses are frequent in automotive ignition systems, for example due to contact chatter in ignition breaker contacts or due to other stray influences.

Various changes and modification may be made within the scope of the inventive concept.

I claim:

1. Test apparatus for coupling to the ignition system of internal combustion engines having
   coupling means (10, 11, 12) adapted to be coupled to the ignition system of an internal combustion engine, and a pulse-shaping circuit connected to the output of the coupling means and providing an output signal having a predetermined relation to the ignition pulses regardless of additional spurious pulses being applied to the coupling means, said circuit comprising
   a semiconductor switch (22, 35) providing said output signal upon change of state thereof;
   and a charge storage circuit (26, 34) connected to the coupling means (10, 11, 12) and to the semiconductor switch (22, 35), said charge storage circuit having a short loading time and a re-loading or discharge time which is long with respect to said loading time to rapidly transfer a pulse applied thereto to the switch and cause rapid change of state of said switch while slowly unloading the pulse stored therein and prevent further change of state of operation of said switch during said unloading or discharge time.

2. Apparatus according to claim 1, wherein (FIG. 1) the semiconductor switch comprises a thyristor having its gate electrode connected to the coupling means (10, 11, 12);
   and the charge storage circuit includes a storage capacitor (26) connected to one of the main electrodes of the thyristor, said charge storage circuit further including a discharge resistor (30) connected to said capacitor (26).

3. Apparatus according to claim 2, further comprising a switching transistor (31) connected to the charge storage capacitor (26), the output signal being derived from the output electrode of the switching transistor (31).

4. Apparatus according to claim 1, wherein the coupling means further comprises a transformer (15, 16, 19), and a transducer (10, 11, 12) adapted for connection to an ignition cable of the internal combustion engine.

5. Apparatus according to claim 1, further comprising a diode (20) and a capacitor (25) connected to the control circuit of the semiconductor switch (22) for reliable triggering of the semiconductor switch.

6. Apparatus according to claim 1, wherein the semiconductor switch comprises a transistor (35), and the charge storage circuit comprises a capacitor (34) connected in the control circuit of the transistor;
   and a discharge resistor (39) is connected to the charge storage capacitor.

7. Apparatus according to claim 1, wherein the charge storage circuit comprises a capacitor (26, 34) and a resistor (30, 39) connected across the capacitor, the time constant of the resistor-capacitor network being just shorter than the time between successive ignition pulses at maximum speed of the internal combustion engine.

8. Apparatus according to claim 1, wherein the charge storage circuit comprises a capacitor (26, 34) and a discharge resistor (30, 39) connected across the capacitor, the charge storage circuit being connected to the control electrode of the semiconductor switch.

9. Apparatus according to claim 1, wherein the coupling means includes a transformer (16) connected to the control electrode of the semiconductor switch;
   and a capacitor (17) connected in parallel to at least one of the windings of the transformer to form an oscillatory circuit therewith.

10. Apparatus according to claim 1, wherein the coupling means includes a transformer (16);
    and a glow discharge element (18) connected between one of the terminals of the primary windings of the transformer (16) and ground, or chassis or mass connection of the internal combustion engine.

* * * * *